United States Patent [19]

Garuts

[11] Patent Number: 4,720,685
[45] Date of Patent: Jan. 19, 1988

[54] FET TRANSCONDUCTANCE AMPLIFIER WITH IMPROVED LINEARITY AND GAIN

[75] Inventor: Valdis E. Garuts, Beaverton, Oreg.

[73] Assignee: Tektronix, Inc., Beaverton, Oreg.

[21] Appl. No.: 902,537

[22] Filed: Sep. 2, 1986

[51] Int. Cl.[4] .......................... H03F 1/32; H03F 3/45
[52] U.S. Cl. .................................... 330/149; 330/253; 330/311
[58] Field of Search ........................ 330/149, 253, 311

[56] References Cited

FOREIGN PATENT DOCUMENTS 58448 8/1982 European Pat. Off. ............ 330/149

OTHER PUBLICATIONS

Kupfer, "Die Differenzkaskodestufe", *Radio Fernsehen Elektronik*, vol. 26, No. 9, 1977, pp. 307-310.
Quinn, "A Cascode Amplifier Nonlinearity Correction Technique", 1981, *IEEE International Solid-State Circuits Conference*, Feb. 19, 1981, pp. 188-189, 272.

*Primary Examiner*—James B. Mullins
*Attorney, Agent, or Firm*—William Y. Conwell; Robert S. Hulse

[57] ABSTRACT

An FET high frequency analog amplifier circuit employs a feed-forward technique to provide a first order correction of amplifier distortion. In one embodiment, the amplifier is configured as a differential set of cascode FET stages. A linearization stage is connected across the output cascode transistors to provide a cancellation signal to reduce amplifier nonlinearities. The linearizing circuit includes a pair of field effect transistors in source-coupled arrangement with their respective bases driven by the drains of the differential amplifier input transistors. The gates are further driven by biasing current sources. The drains of the linearizing transistors are cross connected to the drains of the cascode output transistors, thereby injecting a compensating error signal into each differential output node and cancelling circuit nonlinearities. The amplifier is well suited for fabrication in integrated circuit form, especially using gallium arsenide technology.

19 Claims, 4 Drawing Figures

FET TRANSCONDUCTANCE AMPLIFIER WITH IMPROVED LINEARITY AND GAIN

TECHNICAL FIELD

The present invention relates to FET amplifiers, and more particularly to FET transconductance amplifiers having improved linearity and gain.

Field effect transistors of the gallium arsenide (GaAs) MES FET type are increasingly being used in circuits in which high speed operation is advantageous. Their increasing popularity, however, has not yet extended to high precision, high frequency analog amplifiers. The primary reason is the poor linearity of FET amplifiers. The linearity of FET amplifiers is poor because the drain current of an FET is a nonlinear, power-law function of its gate-to-source voltage. The mechanisms which produce this undesirable trait are inherent in the fundamental physical properties of field effect transistors.

A representative prior art uncompensated FET amplifier, connected in a differential cascode configuration, is shown in FIG. 1. The transfer characteristics of this amplifier are shown by the graph of FIG. 2. As can be seen, the amplifier's transfer characteristics are approximately linear within the exemplary normalized input voltage range of 0 to 0.37 volts marked "A" in FIG. 2. The transfer characteristics of the amplifier for input voltages above the range marked "A" are compressively nonlinear. Each increase in voltage input yields a progressively smaller than linear increase in current output. The dashed line in the lower portion of FIG. 2 indicates the departure of the actual FET transfer characteristics from an ideal, linear transfer characteristic.

The signal-amplitude errors induced by FET nonlinearities make uncompensated FET amplifiers unsuited for use in precision analog amplifier applications. One approach to reducing these signal-amplitude errors is to constrain the maximum linear output signal to be a relatively small fraction of the total available output signal. For example, in the circuit illustrated in FIGS. 1 and 2, the amplifier can be constrained to operate within the operating region marked "A" with a consequent improvement in linearity. This approach, however, severely limits amplifier dynamic range.

A contrasting prior art method to improve linearity over a larger signal range is to increase the amplifier's static bias current. By this method, larger output current swings can be accommodated. This method, however, increases device power dissipation and device size. The increased device size in turn increases the fabrication costs and decreases the achievable bandwidth due to larger interelement capacitances.

Still another prior art method of reducing amplifier error is through the use of feedback techniques. In feedback amplifiers, the output signal is sensed and fed back to the input so that linearity errors are canceled to a degree. While feedback amplifiers having very high precision can be designed, they have several limitations which make them unsuited for high precision wideband signal processing. For example, adequate damping becomes difficult to obtain as the frequency increases. Also, small inherent time delays around the feedback loop can cause the output to be out of phase with the input. Phase distortion can thus be introduced which increases with frequency, thereby further degrading amplifier precision and ultimately causing instability.

An example of a current feedback technique applied to the amplifier of FIG. 1 is shown by the dashed resistors connected between the source of each input transistor and current source Io1. These resistors provide a bias voltage to their respective sources which varies with the output current. This varying bias voltage serves to counteract somewhat the nonlinearities inherent in the FETs, thereby reducing signal-amplitude distortion.

The resistive feedback technique illustrated in FIG. 1 also reduces the gain of the amplifier stage. To compensate for this gain loss, more amplifier stages are required. Alternatively, the gain reduction can be minimized by decreasing the size of the feedback resistors and correspondingly increasing the device size and bias current of the transistors. This solution, however, leads to the increased power dissipation and fabrication cost problems noted above.

Accordingly, a need remains for an FET amplifier having improved linearity and gain.

SUMMARY OF THE INVENTION

One object of the present invention is to provide a high precision, high frequency FET amplifier in which transistor nonlinearity is compensated without sacrificing gain and without introducing phase distortion.

Another object of the present invention is to increase greatly the fraction of the maximum output signal from an FET amplifier which is usable with good linearity.

Still another object of the present invention is to extend the dynamic range of an FET transconductance amplifier without reducing its gain.

Yet another object of the present invention is to increase the achievable gain-bandwidth product of an FET transconductance amplifier.

Still another object of the present invention is to provide a stable, high-precision amplifier constructed of few parts and being simple in operation.

In accordance with the present invention, a linearization stage is coupled to an FET cascode amplifier to sense the drain current nonlinearities of its input stage and to develop a corresponding error signal. This error signal is injected into the output stage of the amplifier to cancel its distortion. The linearization stage serves the further purpose of increasing amplifier gain.

In a differential amplifier embodiment, the main amplifier comprises an input stage including a first source-coupled pair of field effect transistors which receive at their bases a differential input signal. The respective sources of a second pair of field effect transistors in an output stage of such differential amplifier are coupled to the drains of the first pair of transistors in a cascode arrangement. The drains of the second pair of transistors provide the differential amplifier outputs. The gates of the second pair of transistors are biased by biasing voltage sources.

The linearizing circuit connected across the second amplifier transistors includes a third pair of field effect transistors in source-coupled arrangement with their respective bases driven by the drains of the first amplifier transistors. The gates of such third transistors are also connected to biasing current sources. The drains of the linearizing third transistors are cross connected to the drains of the second output transistors, thereby injecting a compensating error signal into each differential output node to provide cancellation of nonlinearities.

The foregoing and additional objects, features and advantages of the present invention will be more readily apparent from the following detailed description of a preferred embodiment thereof, which proceeds with reference to the accompanying drawings.

DETAILED DESCRIPTION

Figure 1:
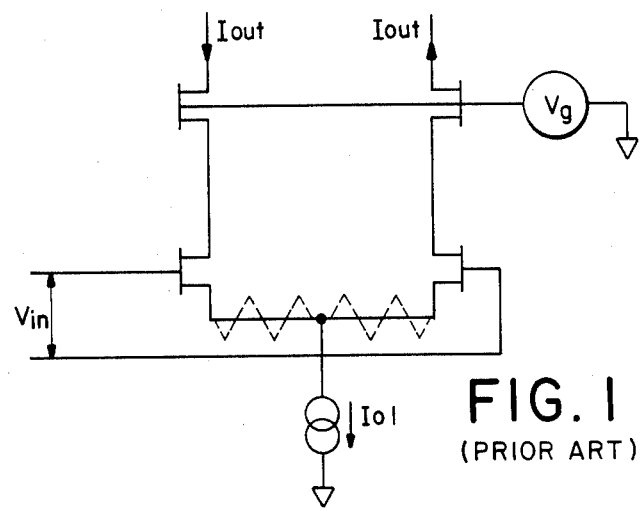
FIG. 1 is a schematic diagram of a prior art uncompensated FET cascode amplifier.
Figure 3:
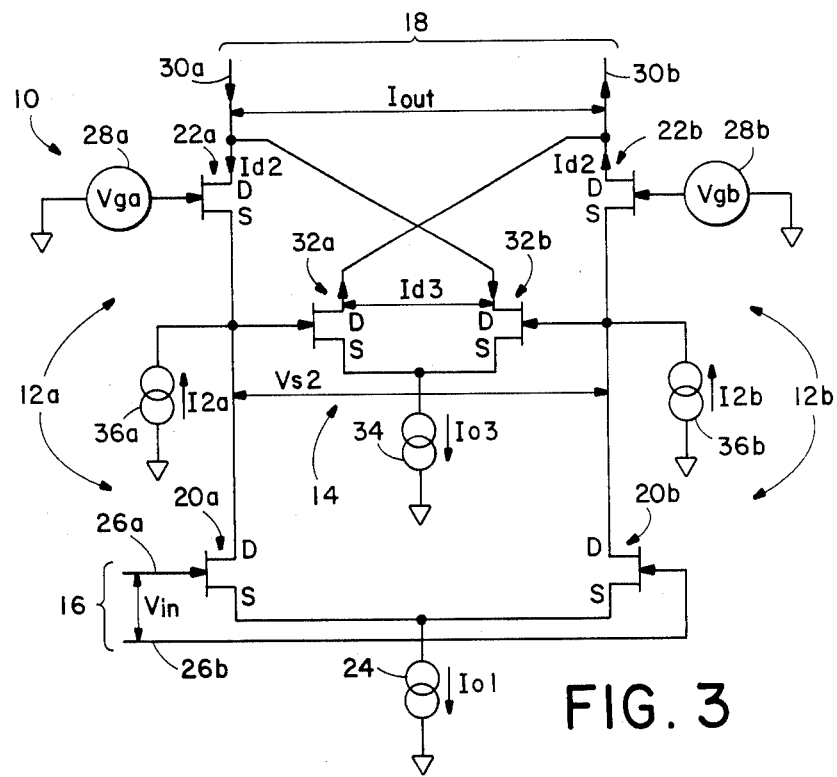
FIG. 3 is a schematic diagram of a compensated differential FET cascode amplifier circuit according to the present invention.

With reference to FIG. 3, the compensated amplifier circuit 10 of the present invention includes a differential pair of cascode amplifiers 12a and 12b, a linearizing circuit 14, a differential voltage input 16 and a differential current output 18. Since the topology of the differential circuitry is symmetrical and the operation of each half correspondingly identical, the following discussion focuses on the left hand side of the circuit. It should be understood, however, that the discussion is equally applicable to the right hand side of the circuit.

Cascode amplifier 12a includes input and output FETs 20a, 22a connected in cascode arrangement, with the drain of FET 20a connected to the source of FET 22a. The source of FET 20a and the source of corresponding FET 20b are connected to a source 24 of current Io1. The gate of input FET 20a is driven by an input 26a of differential voltage input 16. The gate of output FET 22a is driven by a source 28a of bias voltage Vga and the drain of such FET is connected to a current output node 30a of the differential current output 18.

The linearizing stage 14 includes two FETs, 32a and 32b, connected in a common source arrangement. The common sources of FETs 32a and 32b are connected to a common source 34 of bias current Io3. The gate of FET 32a is connected to the drain of input FET 20a and is also connected to a source 36a of D.C. bias current I2a. The drain of linearizing FET 32a is cross-connected to the drain of output FET 22b at current output node 30b.

Circuit 10 operates as follows. If transistors 22a and 22b have the same geometry as transistors 20a and 20b, and ignoring for a moment current sources 36a and 36b, then the voltage Vs2 across the sources of transistors 22a and 22b is equal to the differential input voltage Vin applied at differential voltage input 16. With bias current sources 36a and 36b added, Vs2 increases nonlinearly faster than Vin (expansive nonlinearity). This voltage is applied across the gates of the common source linearization stage 14. Consequently, the drain current Id3 of linearizing stage transistors 32a and 32b also increases faster than linearly with Vin. Due to the nonlinearity of the input transistors 20, the output current Id2 of differential cascode amplifier transistors 22 (which equals Iout in topologies without the linearization stage) increases slower than linearly with Vin (compressive nonlinearity).

The output signal current Iout is the sum of the differential cascode amplifier's output current (Id2) plus the linearization stage's output current (Id3). By properly proportioning the device sizes and bias currents, the opposite nonlinearities of Id2 and Id3 with respect to Vin cancel over most of the available output signal range, thereby causing Iout to vary linearly with Vin. This linearization is achieved without the reduced gain, increased static bias current, increased heat, reduced bandwidth and increased phase distortion problems associated with prior art techniques.

Figure 2:
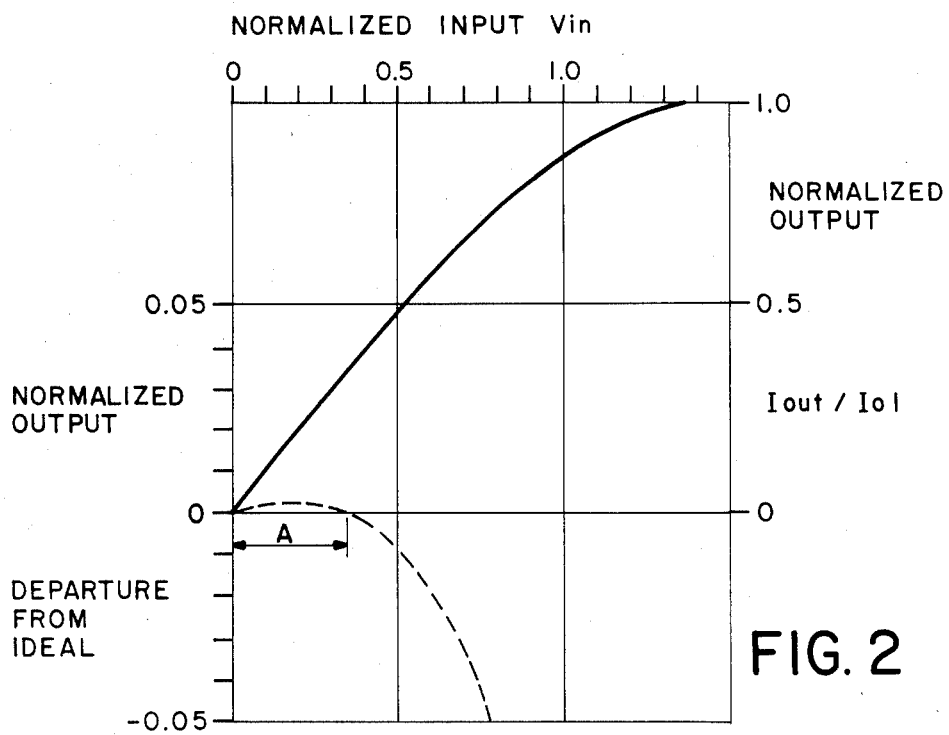
FIG. 2 is a graph illustrating the transfer characteristics of the uncompensated amplifier of FIG. 1.
Figure 4:
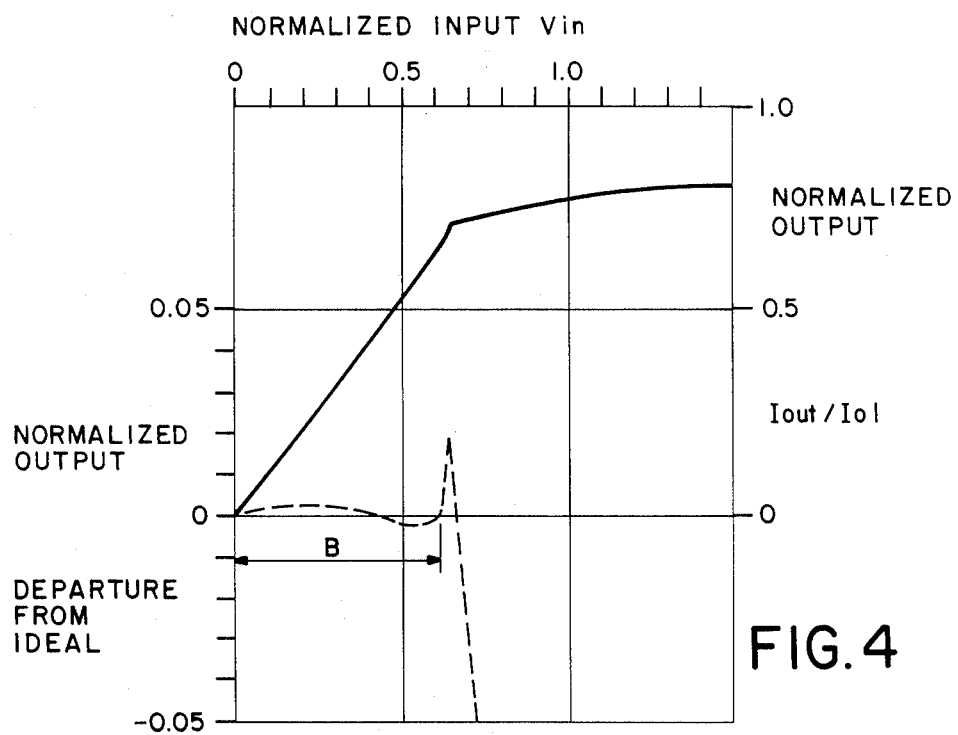
FIG. 4 is a graph illustrating the transfer characteristics of the compensated amplifier of FIG. 3.

FIG. 4 is a graph illustrating the transfer characteristics of the compensated amplifier of FIG. 3. As can be seen by comparison with the graph of FIG. 2, the present invention provides a substantial expansion of the amplifier's linear operating region. While the uncompensated amplifier is approximately linear over the normalized 0 to 0.37 volt range marked "A" in FIG. 2, the compensated amplifier is approximately linear over the 0 to 0.61 volt range marked "B" in FIG. 4, an increase in linear dynamic range of over sixty percent.

The results illustrated in FIG. 4 were obtained using equal geometry gallium arsenide transistors 20, 22 and 32 having pinch off voltages of 2.0 volts and zero bias drain currents of 4.0 milliamperes. The gate bias voltage Vga was set to 5.0 volts and current sources Io1, I2a and Io3 were set to 2.0 ma., 0.4 ma. and 1.6 ma. respectively. The biasing sources on the right hand side of the circuit were set to correspondingly identical valves.

The equal geometry of the six field effect transistors in the illustrative embodiment is not essential to the invention, but rather is used for expository convenience. In alternative embodiments, non-identical geometries can be employed if corresponding adjustments are made to the biasing sources.

The present invention provides a number of benefits beyond increased linearity. The addition of the linearizing stage 14 increases both the overall transconductance gain and the available signal output current. Linearizing stage 14 also reduces the output admittance (due initially to the drain-to-gate capacitance of output transistors 22a and 22b), thereby increasing the achievable gain-bandwidth product.

The present invention can be practiced using both metal and metal oxide FETs. Gallium arsenide MESFETs with Schottky barrier gates can be used advantageously for very high frequency operation.

In the illustrated embodiment, linearizing transistors 32 are used to model the distortion producing mechanisms of transistors 20 and 22. Accordingly, the characteristics of transistors 20, 22 and 32 should be as evenly matched as possible.

All transistors in the present invention can be connected directly to one another without any intermediate components. Since the circuit topology is so simple, such configuration is ideally adaptable to integrated circuit fabrication. Of course, discrete transistors may alternatively be employed. However, it is easier to match components and insure high performance with integrated circuit construction.

Having described and illustrated the principles of my invention with reference to a preferred embodiment, it should be apparent to those skilled in the art that the invention can be modified in arrangement and detail without departing from such principles. I claim all modifications coming within the scope and spirit of the following claims.

I claim:

1. A field effect transistor amplifier circuit of greater linearity and increased gain, comprising:

an input amplifier stage comprising a pair of input field effect transistors having their gates connected across a source of input signal voltage;

an output amplifier stage comprising a pair of output field effect transistors having their sources connected to the outputs of different ones of said input transistors and having their outputs connected to output terminals to provide an output signal current; and a correction amplifier stage comprising a pair of compensating field effect transistors connected as a nonlinear common source amplifier stage with their gates connected to the sources of different ones of said output transistors and their drains connected to the outputs of the opposite ones of said output transistors to which their gates are connected.

2. An amplifier circuit in accordance with claim 1 in which the input transistors are connected as a common source amplifier stage.

3. An amplifier circuit in accordance with claim 2 in which the output transistors are connected as a common gate amplifier stage.

4. An amplifier circuit in accordance with claim 3 in which the input transistors are connected to the output transistors to form a cascode differential amplifier circuit.

5. An amplifier circuit in accordance with claim 1 in which a source of D.C. bias current is connected to the drain of each of the input transistors.

6. An amplifier circuit in accordance with claim 5 in which the D.C. bias current and the compensating transistors are of the proper size so that the nonlinearities of the drain currents of said output transistors and of said compensating transistors cancel each other over a substantial portion of the output signal range.

7. An amplifier circuit in accordance with claim 1 in which said field effect transistors are made of gallium arsenide semiconductor material.

8. An amplifier circuit in accordance with claim 1 in which the transistors are directly connected together without using additional circuit components including feedback resistors.

9. An amplifier circuit in accordance with claim 1 in which said field effect transistors are of the MES type with Schottky barrier gates.

10. An amplifier circuit in accordance with claim 1 in which the input and output transistors comprise a differential cascode amplifier.

11. An amplifier in accordance with claim 1 in which said field effect transistors are fabricated as an integrated circuit.

12. A field effect transistor amplifier circuit of greater linearity and increase gain, comprising:

an input amplifier stage comprising a pair of input field effect transistors connected as a common source amplifier stage with their gates connected across a source of input signal voltage and having their sources connected directly together;

an output amplifier stage comprising a pair of output field effect transistors connected as a common gate amplifier stage with their sources connected to the drains of different ones of said input transistors and their drains connected to provide an output signal current; and a pair of D.C. current sources, each coupled to the drain of one of said input field effect transistors;

a correction amplifier stage comprising a pair of compensating field effect transistors connected as a nonlinear common source amplifier stage with their gates connected to the sources of different ones of said output transistors and their drains connected to the drains of the opposite ones of said output transistors to which their gates are connected.

13. An amplifier circuit in accordance with claim 12 in which the input transistors are connected to the output transistors to form a cascode differential amplifier circuit.

14. An amplifier circuit in accordance with claim 13 in which the D.C. current sources and the compensating transistors are of the proper size so that the nonlinearities of the drain currents of said output transistors and of said compensating transistors cancel each other over a substantial portion of the output signal range.

15. An amplifier circuit in accordance with claim 12, in which said field effect transistors are made of gallium arsenide semiconductor material.

16. An amplifier circuit in accordance with claim 12 in which the transistors are directly connected together without using additional circuit components including feedback resistors.

17. An amplifier circuit in accordance with claim 16 in which the input and output transistors comprise a differential cascode amplifier.

18. An amplifier circuit in accordance with claim 12 in which said field effect transistors are of the MES type with Schottky barrier gates.

19. An amplifier circuit in accordance with claim 12 in which said field effect transistors are fabricated as an integrated circuit.

* * * * *